United States Patent
Derbenwick (10) Patent No.: US 7,053,433 B1
(45) Date of Patent: May 30, 2006

(54) ENCAPSULATED FERROELECTRIC ARRAY

(75) Inventor: Gary F. Derbenwick, Colorado Springs, CO (US)

(73) Assignee: Celis Semiconductor Corp., Colorado Springs, CO (US)

(*) Notice: Subject to any disclaimer, the term of this patent is extended or adjusted under 35 U.S.C. 154(b) by 0 days.

(21) Appl. No.: 10/135,488

(22) Filed: Apr. 29, 2002

(51) Int. Cl.
H01L 27/108 (2006.01)

(52) U.S. Cl. ...................... 257/296; 257/297

(58) Field of Classification Search ........ 257/295–300, 257/3; 438/238, 239, 386, 399
See application file for complete search history.

(56) References Cited

U.S. PATENT DOCUMENTS

| | | | | |
|---|---|---|---|---|
| 5,955,758 A | * | 9/1999 | Sandhu et al. | 257/296 |
| 6,144,060 A | * | 11/2000 | Park et al. | 257/298 |
| 6,303,456 B1 | * | 10/2001 | Pricer et al. | 257/347 |
| 6,309,956 B1 | * | 10/2001 | Chiang et al. | 438/622 |
| 6,674,110 B1 | * | 1/2004 | Gnadinger | 257/295 |

FOREIGN PATENT DOCUMENTS

JP            06169068 A   *   6/1994

* cited by examiner

Primary Examiner—Hoai Pham
Assistant Examiner—Nathan W. Ha
(74) Attorney, Agent, or Firm—Mark G. Pannell; Hanes & Schutz, LLC (57) ABSTRACT

A ferroelectric layer within an array of ferroelectric FETs is encapsulated between a bottom barrier dielectric layer and a top barrier dielectric layer extending beyond the ferroelectric layer. The ferroelectric FETs are formed on first conductivity type silicon, each having two second conductivity type silicon regions within the first conductivity type silicon separated by some distance. The two second conductivity type silicon regions forming a source and a drain with a channel region therebetween. A silicon dioxide layer is formed on the channel region, a bottom barrier dielectric layer is formed on the silicon dioxide layer, a ferroelectric layer is formed on the bottom barrier dielectric layer, a top barrier dielectric layer is formed on the ferroelectric layer, and an electrode layer is formed on the ferroelectric layer.

54 Claims, 9 Drawing Sheets

ENCAPSULATED FERROELECTRIC ARRAY

FIELD OF THE INVENTION

This invention relates in general to integrated circuit transistors, and more particularly, to an array ferroelectric field effect transistor having an encapsulated ferroelectric layer.

BACKGROUND OF THE INVENTION

Ferroelectric nonvolatile random access memory devices preserve the stored data state, even when the power supply signal is removed. The logic state of each memory cell generally is based on the electrical polarization of a ferroelectric capacitor, comprised of a ferroelectric material sandwiched between two conductive layers. When an electric field of sufficient magnitude is applied across the ferroelectric capacitor, the ferroelectric material will polarize in the direction of that electric field. The minimum voltage that must be applied across the capacitor in order to initiate reversal of the polarization state is defined as the coercive voltage.

It is well known that the direction of the polarization may be sensed by applying a voltage equal to or greater than the coercive voltage across a ferroelectric capacitor, and sensing the resulting current flow. If the polarity of the voltage applied is opposite to the polarization in a ferroelectric capacitor, the polarization of the ferroelectric capacitor will switch to the opposite state. If, on the other hand, the polarization in the ferroelectric capacitor is the same as the voltage applied, the ferroelectric capacitor will not switch polarization states. Since significantly more current results when a polarization switch occurs than when it does not, the resulting current can be used to determine the logic state of the ferroelectric capacitor. When reading is complete, the memory cells must be rewritten with their original logic state. This method is referred to as a "destructive read out" since the data stored in the ferroelectric capacitor is temporarily overwritten to a known value.

Also known in the art are various a "non-destructive read out" sensing techniques wherein the polarization stored in the ferroelectric capacitor is sensed without disturbing the stored polarization state. Such methods are generally based on detecting the capacitance of the ferroelectric capacitor by applying voltages less than the coercive voltage across the terminals of the ferroelectric capacitor.

Figure 1:
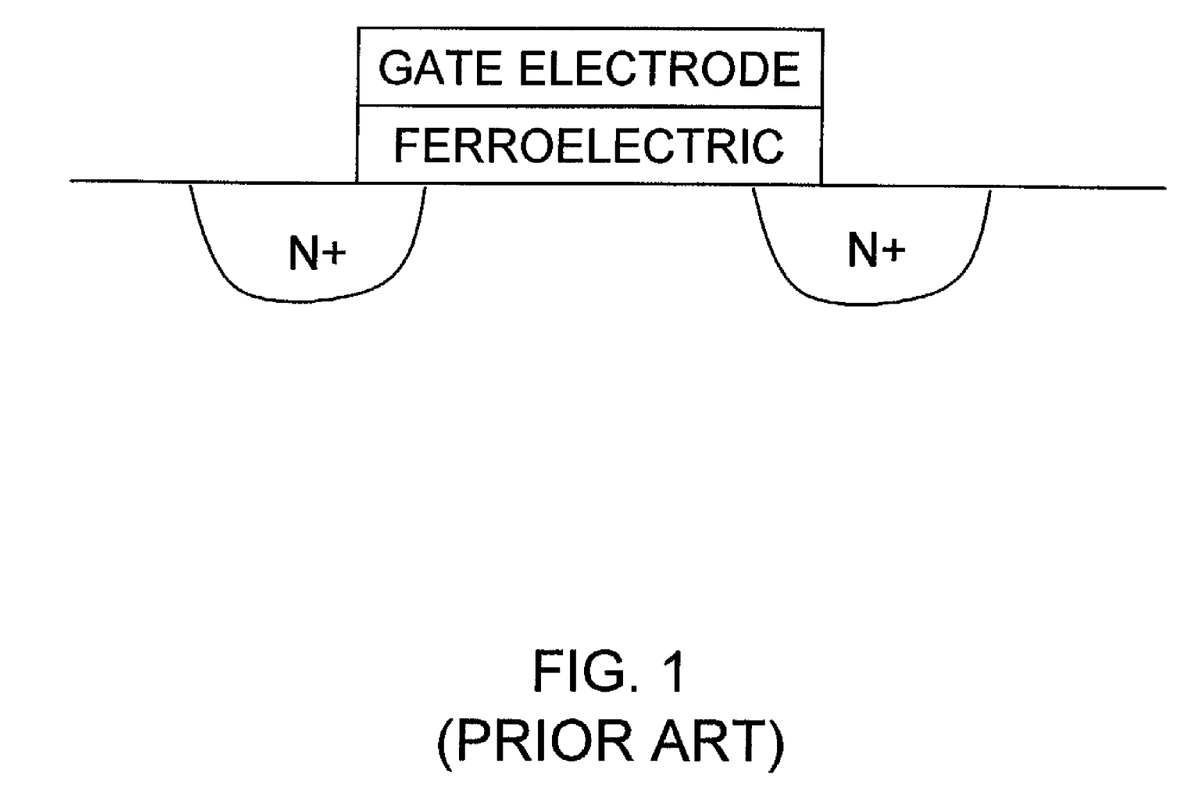
FIG. 1 is a cross sectional drawing showing prior art design of a ferroelectric FET. Dimensions are not to scale.

Ferroelectric memory cells based on sensing the state of polarization of a ferroelectric capacitor, whether sensed destructively or non-destructively, result in a memory cell that requires additional transistor devices for selection of a particular cell within the memory array. Ferroelectric memories based on a class of devices known as ferroelectric FETs could offer significant memory cell size advantages, thereby decreasing the manufacturing cost dramatically. A ferroelectric FET known in the prior art is structurally identical to a metal-oxide-silicon field effect transistor (MOSFET) device with the oxide replaced by a ferroelectric material, as shown in FIG. 1. The state of polarization of the ferroelectric gives rise to an electric field, which shifts the turn-on threshold voltage of the device.

Although this device geometry has some attractive features, it suffers from several severe fabrication difficulties. One such difficulty is the incompatibility with CMOS integrated circuit process technologies. Ferroelectric memories are typically fabricated using a conventional CMOS semiconductor integrated circuit process with some additional process steps to fabricate the ferroelectric structure. The CMOS process generally provides the circuitry for sense amplifiers, decoders, and other circuitry needed for reading and writing. However, ferroelectric materials generally contain compounds and elements that are harmful to the operation of CMOS transistors, thereby risking contamination of the CMOS process facilities. For this reason, ferroelectric deposition is generally designed to be one of the last steps, which can be performed outside the main CMOS processing facility. However, this is generally not an option when producing a ferroelectric FET.

Another incompatibility between the CMOS process and ferroelectric fabrication is the conflicting effects of hydrogen exposure. It is known that hydrogen anneal steps are required in a stable CMOS process in order to reduce surface states. There are numerous sources of hydrogen in a CMOS process including tungsten plugs, inter-level dielectric oxides, alloy steps, passivation deposition, and plastic packaging of the integrated circuit. However, studies have also shown that when a ferroelectric material is exposed to hydrogen, the amount of switching charge degrades. Therefore, the process flow must generally be designed to shield the ferroelectric material from hydrogen while still exposing CMOS devices to hydrogen.

Another fabrication difficulty is diffusion of the ferroelectric material into the silicon causing inadvertent doping of the channel region and uncontrolled threshold voltage shifts of the ferroelectric FET. For example, the element bismuth (Bi) in the typical ferroelectric material SBT (strontium bismuth tantalate) can act as an n-type dopant. Since the sensing circuitry is designed with certain assumptions regarding the turn-on threshold of the ferroelectric FET, such inadvertent doping could result in an incorrect detection of the polarization state.

During thermal treatments that are part of the ferroelectric fabrication process, a thin layer of silicon dioxide generally grows at the silicon/ferroelectric interface due to oxygen exposure. The resulting structure can be viewed as a capacitor comprised of the silicon dioxide in series with a capacitor comprised of the ferroelectric material. Since the dielectric constant of silicon dioxide is low compared to typical ferroelectric materials by orders of magnitude, even an exceedingly thin layer of silicon dioxide will cause the voltage between the semiconductor layer and the top electrode to be divided so that the great majority of the voltage drops across the silicon dioxide layer. The remaining voltage across the ferroelectric material is then typically less than coercive voltage, resulting in slow or even non-existing switching properties.

Another problem in forming a high quality silicon/ferroelectric interface is the mismatch of lattice constants and thermal expansions. Such mismatch gives rise to significant stress on the ferroelectric/silicon interface, creating undesired charge traps and adherence issues.

Figure 2:
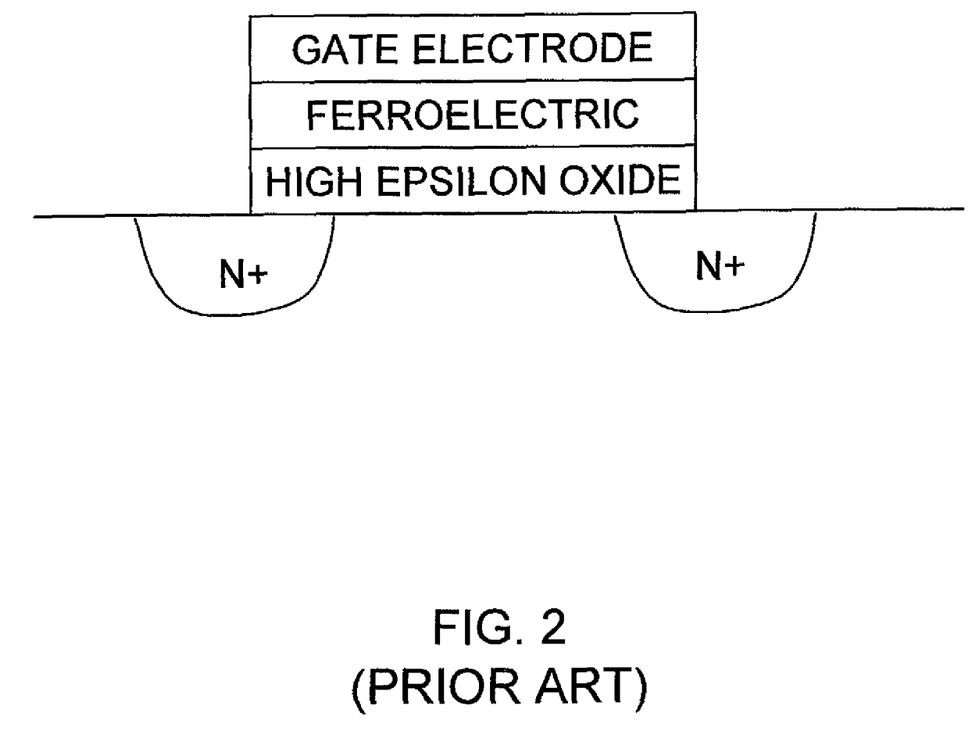
FIG. 2 is a cross sectional drawing showing prior art design of a ferroelectric FET with a dielectric layer between the silicon substrate and the ferroelectric layer. Dimensions are not to scale.

Attempts to solve some of the ferroelectric/silicon interface problems in the prior art include forming a dielectric layer between the silicon substrate and the ferroelectric material, as shown in FIG. 2. This technique is generally not adequate, however. In order to apply a voltage higher than the coercive voltage across the ferroelectric layer, the dielectric constant of the dielectric material forming the dielectric layer must be very high. Compatible linear dielectric materials rarely have dielectric constants greater than 50, which is still more than an order of magnitude less than the dielectric constant of a typical ferroelectric material. When limited to these dielectric materials, the characteristics of the silicon/dielectric interface, though generally an improvement over the ferroelectric/silicon interface, is still inadequate.

In addition to these fabrication difficulties, ferroelectric FETs are known to suffer from poor retention of the logic state stored due to charge injection at the gate electrode/ferroelectric boundary. A high density of free charge accumulates on the surface of the electrode compensating the electric field generated by the polarization fields within the ferroelectric material. Because this accumulation of free charge occurs over a very short distance in the surface of the conductor, a high electric field is generated at electrode/ferroelectric boundary. The field strength is generally sufficiently high in order to inject charge into the ferroelectric material. This injected charge then obscures the electric field generated by the ferroelectric polarization, thereby decreasing the total electric field as seen from the silicon/ferroelectric interface. This compensation does not necessarily alter the flow of current resulting from polarization reversal, and so memory cells based on a ferroelectric capacitor are not typically affected. However, the decrease in total electric field will result in a turn-on threshold shift of a ferroelectric FET, which could result in an incorrect detection of the polarization state. When there is no dielectric material between the ferroelectric layer and the substrate, this charge injection phenomenon can occur on the ferroelectric/substrate interface as well.

As a result of problems introduced by these fabrication and device issues, memory cells based on ferroelectric FET have shown slow switching speeds, high operating voltages, and poor memory retention characteristics.

SUMMARY OF THE INVENTION

According to the principles of the present invention, a ferroelectric layer within an array of ferroelectric FETs is encapsulated by a bottom barrier dielectric layer and a top barrier dielectric layer extending beyond the ferroelectric layer, thereby providing improved data retention and compatibility to integrated circuit processes. The ferroelectric FETs are formed on first conductivity type silicon, each having two second conductivity type silicon regions within the first conductivity type silicon separated by some distance forming the source, drain, a channel region, the channel region being between the source and drain. A silicon dioxide layer is formed on the channel region, a bottom barrier dielectric layer is formed on the silicon dioxide layer, a ferroelectric layer is formed on the bottom barrier dielectric layer, a top barrier dielectric layer is formed on the ferroelectric layer, and an electrode layer is formed on the ferroelectric layer. Connections to the sources and drains of the ferroelectric FETs are made via second conductivity type silicon formed in the first conductivity silicon underneath the bottom barrier dielectric layer. The gates of the ferroelectric FETs are formed with a conductive layer above or below the top barrier dielectric layer. In the case where the conductive layer is below the top barrier dielectric, contact to other conductive layers is made by breaking the top barrier dielectric layer some distance beyond the edge of the ferroelectric layer. The bodies of the ferroelectric FETs are coupled to the substrate if the ferroelectric FET was formed on silicon substrate, to the well if the ferroelectric FET was formed on the silicon surface within a well, or to each region of first conductivity type silicon isolated by second conductivity type silicon if the ferroelectric FET was formed on silicon on insulator (SOI).

DETAILED DESCRIPTION OF THE INVENTION

Figure 3:
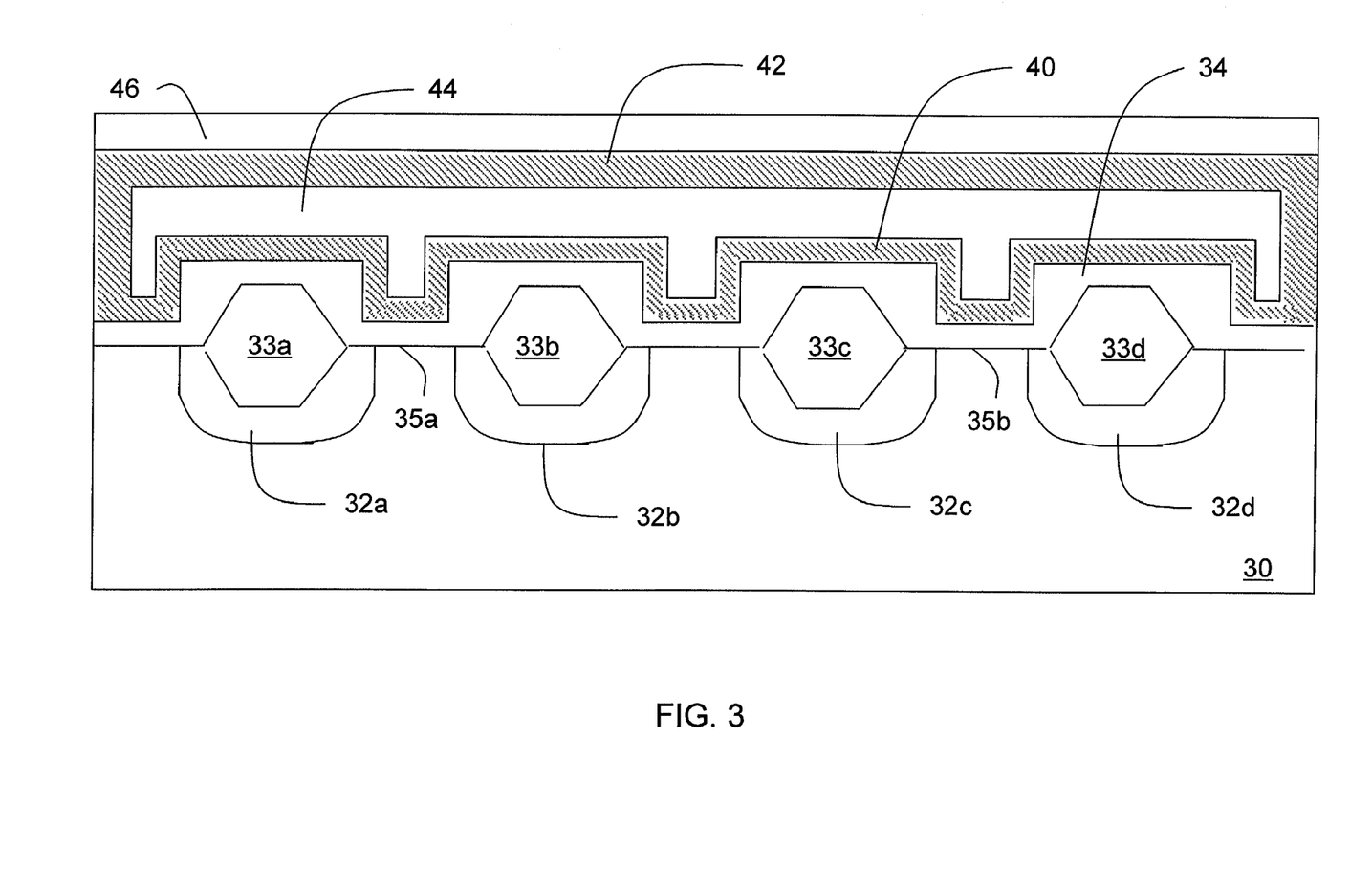
FIG. 3 is a cross sectional drawing illustrating one embodiment of the present invention. Dimensions are not to scale.

FIG. 3 is a cross sectional view illustrating the structure of a memory array according to one embodiment of the present invention. In one embodiment, P+ regions are formed on the surface of n-type silicon, first conductivity type semiconductor, substrate 30 spaced apart by some distance, forming p-type silicon, second conductivity type semiconductor, regions 32a–d. The remainder of this description will describe n-type silicon as the first conductivity type semiconductor and p-type silicon as the second conductivity type semiconductor. However, different semiconductor types are included within the scope of the present invention. For example, in an alternative embodiment, first conductivity type semiconductor is p-type silicon and second conductivity type semiconductor is n-type silicon.

A field oxide is formed on the p+ regions 32a–d, forming field oxide regions 33a–d. A layer of gate dielectric 34 is formed on the top surface of the resulting structure. Bottom barrier, or first, dielectric layer 40 is formed on gate dielectric 34. Ferroelectric layer 44 is formed on bottom barrier dielectric layer 40 over the memory array. A layer of top barrier, or second, dielectric 42 is formed over ferroelectric layer 44, top barrier dielectric 42 extended to completely encapsulate the ferroelectric layer 44. A layer of bottom barrier dielectric layer 40 and a top barrier dielectric layer 42 then completely encapsulates a ferroelectric layer 44 within a memory array.

Bottom barrier dielectric layer 40 and top barrier dielectric layer 42 are any dielectric material. In one embodiment, bottom barrier dielectric layer 40 and top barrier dielectric layer 42 is any material that is impermeable to or absorbs hydrogen. Where bottom barrier dielectric layer 40 and top barrier dielectric layer 42 either are impermeable to or absorb hydrogen, retention is significantly increased in the FET by reducing exposure of the ferroelectric layer 44 to hydrogen.

In another embodiment, bottom barrier dielectric layer 40 and top barrier dielectric layer 42 are any material that is impermeable to the materials of ferroelectric layer 44. The materials of the ferroelectric layer 44 are the elements contained in ferroelectric layer 44. Where bottom barrier dielectric layer 40 and top barrier dielectric layer 42 are impermeable to the materials of ferroelectric layer 44, the risk of contamination of the integrated circuit process facilities and of inadvertently doping or otherwise damaging the surface of silicon substrate 30 is reduced.

Examples of materials for bottom barrier dielectric layer 40 and top dielectric layer 44 are silicon nitride, oxynitride, and aluminum oxide.

Examples of suitable material for ferroelectric layer 44 include the class of Cerium Manganates Cerium Chromates, Niobates such as lead cadmium niobate and cadmium niobate, and other ferroelectric materials with a relatively low dielectric constant, typically having an epsilon of 100 or less.

In one embodiment, the individual memory storage elements within the array are arranged in rows and columns, and are any memory cell that is interconnected with layers of conductive or semiconductor material that does not require breaking top barrier dielectric layer 42 or bottom barrier dielectric 40 to make contact. For purposes of illustration, memory cells in this embodiment reside between field oxide regions, such as the ferroelectric FET between field oxide regions 33a and 33b, having gate electrode 46, p+ source region 32a, p+ drain region 32b, a channel region 35a between them.

Figure 4:
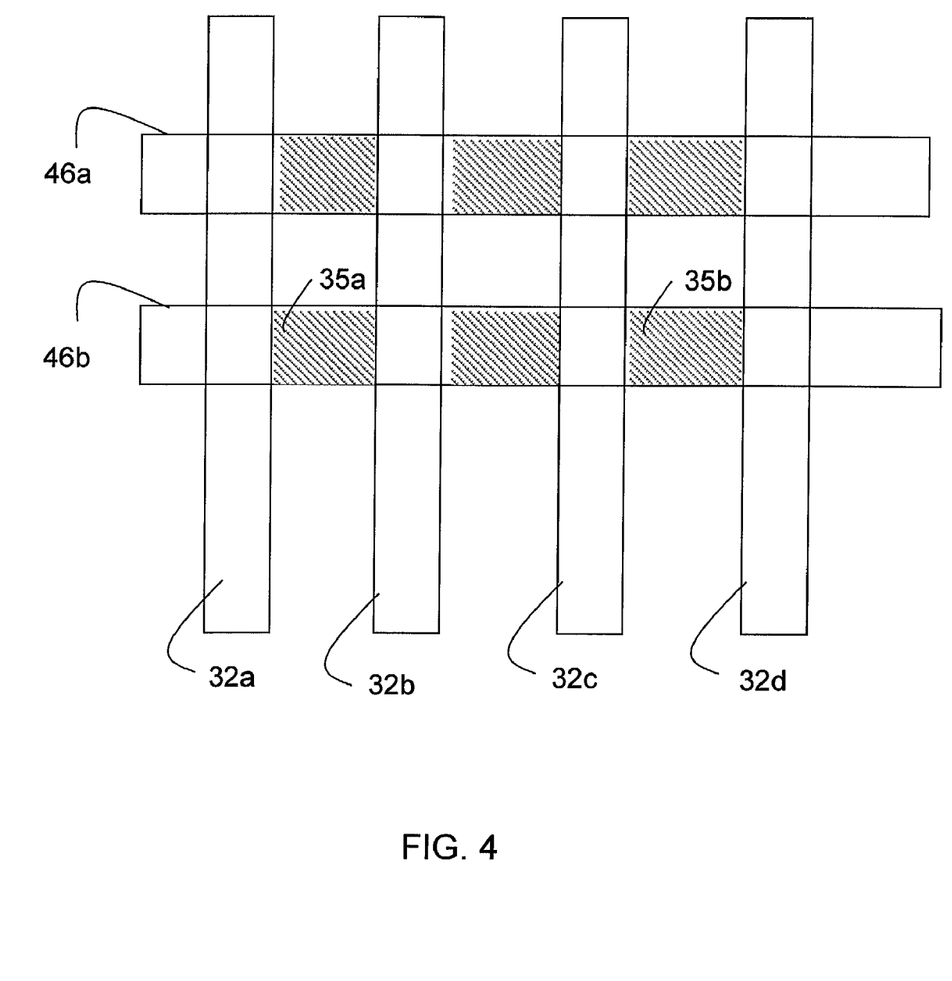
FIG. 4 illustrates a planar view of one embodiment of the present invention.

FIG. 4 illustrates the arrangement of ferroelectric memory cells from a planar view. Like numbers on FIG. 3 and FIG. 4 indicate like elements of the structure. The gates of the ferroelectric FETs in a given row share a common polysilicon wordline. Two wordlines, 46a and 46b, are shown in FIG. 4. Sources of the ferroelectric FETs in a given column share a common buried p+ bit line. Two bit lines, 32a and 32c, are shown. Field oxide overlies the p+ regions. Drains of the ferroelectric FETs in a given column share a common bit line bar. Two bit line bar lines, 32b and 32d, are shown. The channel region of the ferroelectric FET is formed in regions where polysilicon intersects the region between the bit line and bit line bar. Two channels, 35a and 35b, are shown.

An advantage of the present invention is that the ferroelectric/top electrode interface is eliminated by the formation of top barrier dielectric layer 42, thereby significantly reducing charge injection from the electrode layer 46 into ferroelectric layer 44 and increasing memory retention.

Another advantage of the present invention is that the formation of gate dielectric layer 34 will inhibit the inadvertent growth of silicon dioxide on the ferroelectric/silicon substrate boundary.

Figure 5:
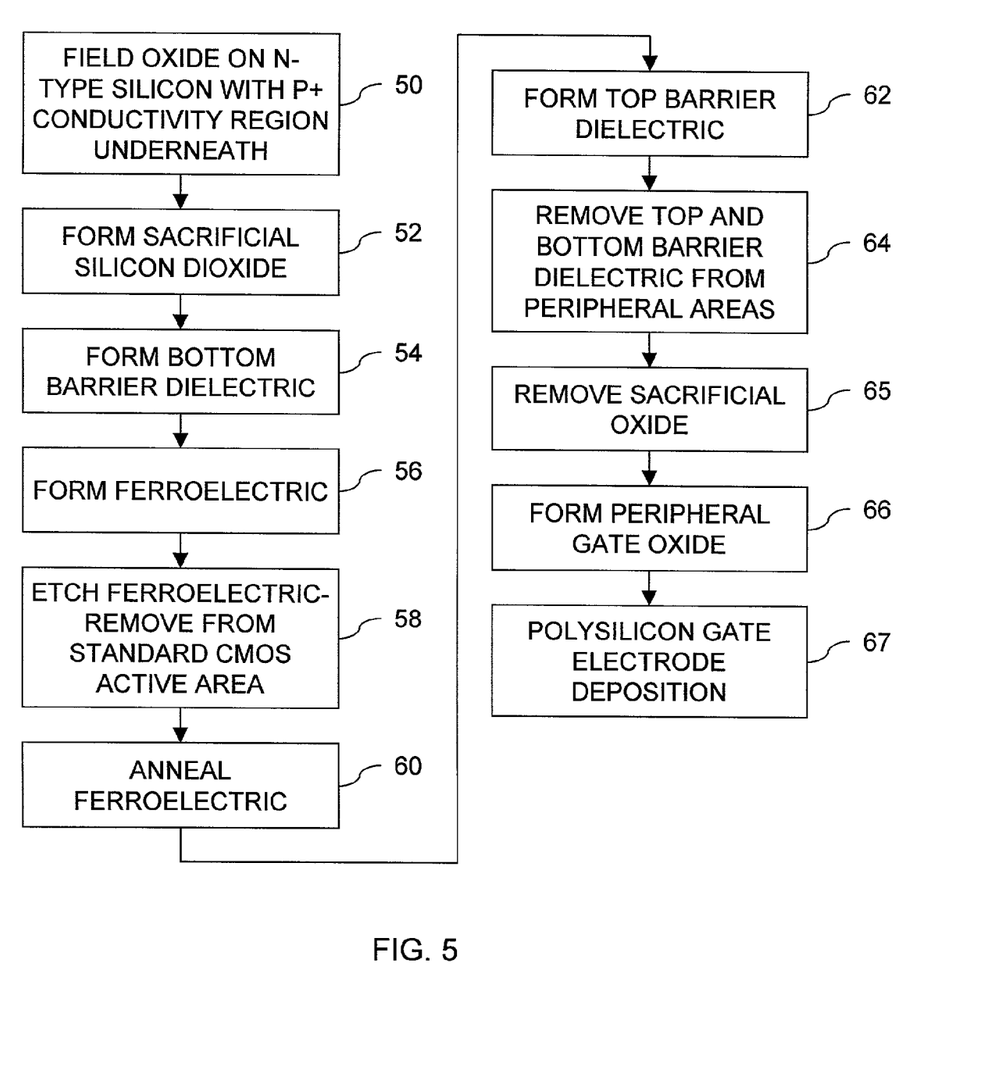
FIG. 5 illustrates the process steps to provide one embodiment of the present invention.

FIG. 5 illustrates one method of integrating the encapsulation method according to the present invention into a standard CMOS process. A p+ conductivity type region is formed under a field oxide utilizing LOCOS processing on n-type silicon substrate, on an n-type well formed in a p-type silicon substrate, or on n-type silicon layer on insulator (50). A layer of silicon dioxide forms a sacrificial oxide in the gate region of the standard CMOS transistor and a first dielectric layer in the gate region of the ferroelectric FET (52). Silicon nitride is deposited, forming the bottom barrier dielectric layer (56). A ferroelectric layer is deposited on top of the bottom barrier dielectric layer (58). The ferroelectric layer is patterned and etched (58). All ferroelectric material outside the memory array is removed in the patterning and etching (58). The ferroelectric layer within the memory array is either one continuous layer or patterned inside the array. Patterning of the ferroelectric layer within the array allows the formation of non-ferroelectric FETs in the array, which could be utilized as a selection means in some memory cell architectures. The ferroelectric material is thermally annealed (60) according to the material requirements of the ferroelectric material. The top barrier dielectric layer is deposited (62), and patterned such that the top barrier dielectric layer extends beyond the ferroelectric layer. The ferroelectric material is thereby encapsulated between the bottom barrier dielectric layer and the top barrier dielectric layer. Since the ferroelectric layer was removed in the peripheral area. The peripheral area being the area outside of the memory array containing the ferroelectric FETs, the top barrier dielectric layer is formed on top of the bottom barrier dielectric layer in the peripheral area. A single etch step removes the top and bottom barrier dielectric layers at the same time (64), exposing the sacrificial oxide layer in the peripheral area. If the material used for top and bottom dielectric layer is silicon nitride, this could be accomplished utilizing a wet etch such as hot phosphoric acid. The sacrificial oxide is removed outside the memory array, for example with a short exposure to hydrofluoric acid (65). The gate oxide for the standard CMOS device is then grown (66). Polysilicon is deposited (67), forming the gate electrode for the ferroelectric FET and for the standard CMOS device. The standard CMOS process continues from this point.

In variations of this embodiment, the ferroelectric material is alternatively annealed prior to patterning the ferroelectric layer, after the deposition of the top barrier dielectric layer, or after patterning the top barrier dielectric layer, according to the requirements of the ferroelectric material.

The above-described memory cell is utilized for illustration purposes only. In other variations of this embodiment, any memory cell wherein the sources and drains are connected with connection means below the bottom barrier dielectric layer is within the scope of this invention One advantage of this encapsulation technique is that the ferroelectric material is entirely contained within the bottom and the top barrier dielectric layers, thereby eliminating a concern that the elements comprising the ferroelectric material might contaminate processes that form the standard CMOS transistors. This encapsulation technique also reduces hydrogen exposure of the ferroelectric material, thereby increasing memory retention time.

Another advantage of this technique is that only two additional non-critical masks are required in addition to the masks required for standard CMOS processing, one mask to etch the ferroelectric layer and one to remove the top and bottom barrier dielectric layer from the peripheral areas.

Etching of the ferroelectric material is generally difficult. Since the ferroelectric layer in this embodiment does not contain critical dimensions, low cost etch methods, such as ion milling, can be utilized.

Another advantage is that the additional process steps comprising the ferroelectric deposition, ferroelectric thermal anneal, ferroelectric etch, and a top barrier dielectric deposition can be performed utilizing relatively inexpensive equipment. Since the processing steps forming the ferroelectric FETs are generally performed outside the CMOS production facility due to contamination concerns, the cost of a separate facility can be an important factor.

In variations of this embodiment, a metal layer of the standard CMOS process, platinum, another metal, or a semiconducting electrode is used as the ferroelectric FET gate electrode instead of polysilicon.

In another variation of this embodiment, the gate silicon dioxide layer formed in step 52 is removed over the peripheral areas after the barrier dielectric etch in step 64. A separate gate oxide for the standard CMOS devices is then formed before the polysilicon gate electrode deposition. This variation of the embodiment allows a different thickness of silicon dioxide in the ferroelectric FET and the standard CMOS FET.

In another variation of this embodiment, the standard CMOS transistor is produced through to, but not including, the gate electrode polysilicon layer. Thereafter the ferroelectric structures are produced in the array. Polysilicon is then deposited, forming the gate electrode for the standard CMOS devices and the ferroelectric FET in the array.

In another variation of this embodiment, the sacrificial oxide formed in step 52 need not be removed, and serves as the gate oxide.

Figure 6:
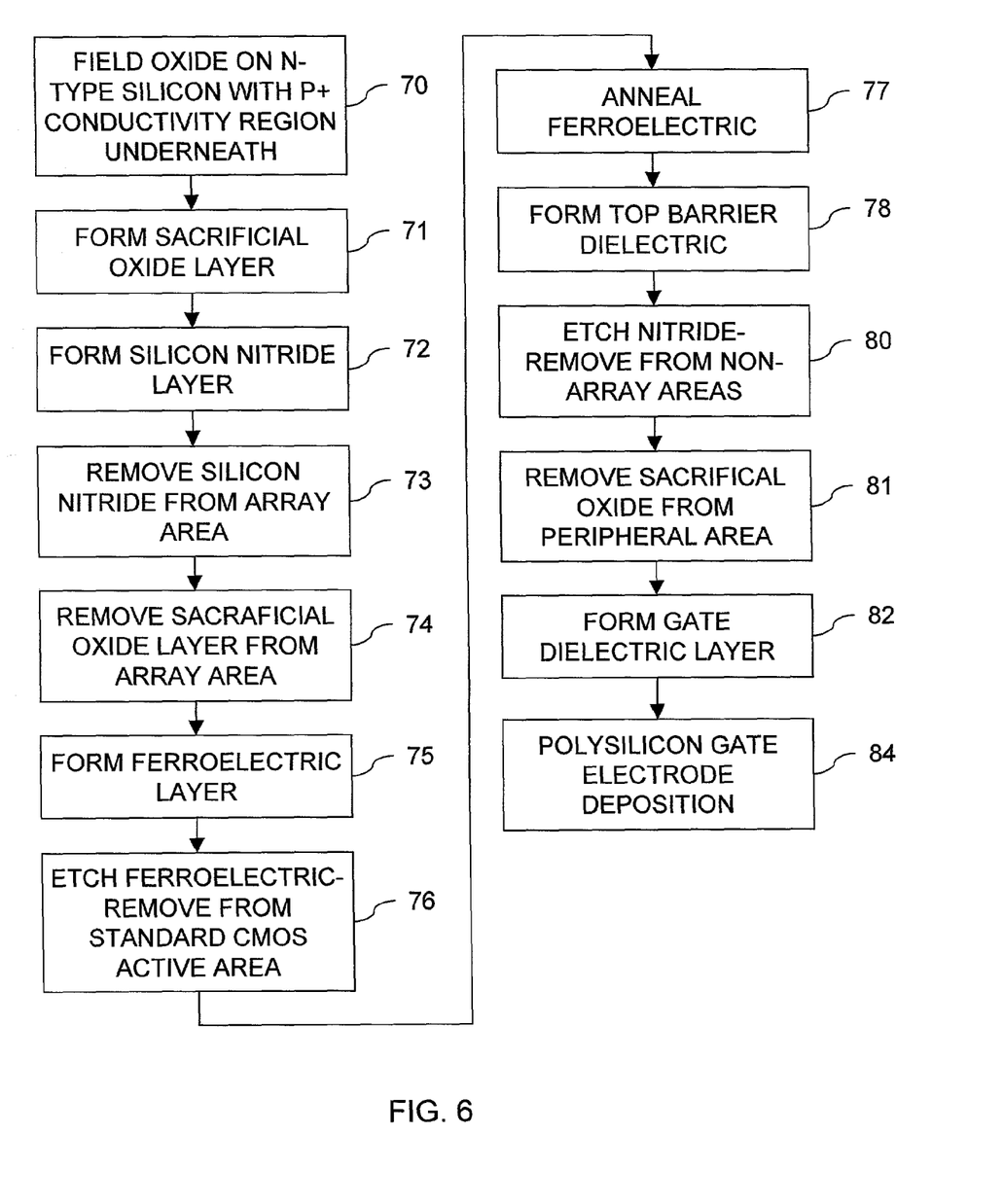
FIG. 6 illustrates a process flow in an alternative embodiment wherein the ferroelectric layer is deposited directly on the silicon.

FIG. 6 illustrates a process flow in an alternative embodiment wherein the ferroelectric layer is deposited directly on the silicon. A sacrificial oxide layer is formed (71), and a silicon nitride is formed on top of the sacrificial oxide (72). The silicon nitride is removed from the array area (73), followed by the removal of the sacrificial oxide in the array area (74). The ferroelectric layer is formed (75), and is then removed in peripheral areas where standard CMOS transistors are to be formed (76). The ferroelectric is then annealed (77) as required by the ferroelectric material. A top barrier dielectric layer is then deposited (78), and is removed in the peripheral areas where standard CMOS transistors are to be formed (80) along with the silicon nitride formed in step 73. If the barrier dielectric layer requires different etch chemistry from the silicon nitride, these layers will need to be removed in multiple steps, as appropriate for the material used as a barrier dielectric layer. The sacrificial oxide is removed in the peripheral area (81). The gate dielectric is grown (82). If silicon nitride is used as the top barrier dielectric, the gate oxide will grow only in the peripheral areas since silicon dioxide does not grow under silicon nitride. The polysilicon layer is then deposited (84), forming the gate electrode for standard CMOS transistors and the ferroelectric FETs in the memory array. Standard CMOS processing continues from this point. This structure does not have a bottom barrier dielectric layer, but the ferroelectric material is encapsulated from the top by the top barrier dielectric layer.

In one variation of this embodiment, a buffer oxide layer is formed before the formation of the ferroelectric layer in step 75, thereby forming a layer of buffer oxide between the substrate and the ferroelectric layer. The use of a buffer oxide depends on whether the choice of ferroelectric material requires direct contact with the silicon lattice structure to form the appropriate ferroelectric phase, and whether the appropriate ferroelectric phase will form on amorphous silicon dioxide. When the buffer oxide can be used, one advantage is to minimize charge injection from the channel region into the ferroelectric layer due to high electric fields that are formed on the substrate/ferroelectric interface.

In another variation of this embodiment, a metal in the standard CMOS process, platinum, another metal, or a semiconducting electrode is used as the gate electrode of the ferroelectric FETs in the memory array instead of the polysilicon.

In another variation of this embodiment, the standard CMOS transistor is produced through to, but not including, the gate electrode polysilicon layer. Then the ferroelectric structures are produced in the array. Polysilicon is the deposited, forming the gate electrode for the standard CMOS devices and the ferroelectric FET in the array.

Figure 7:
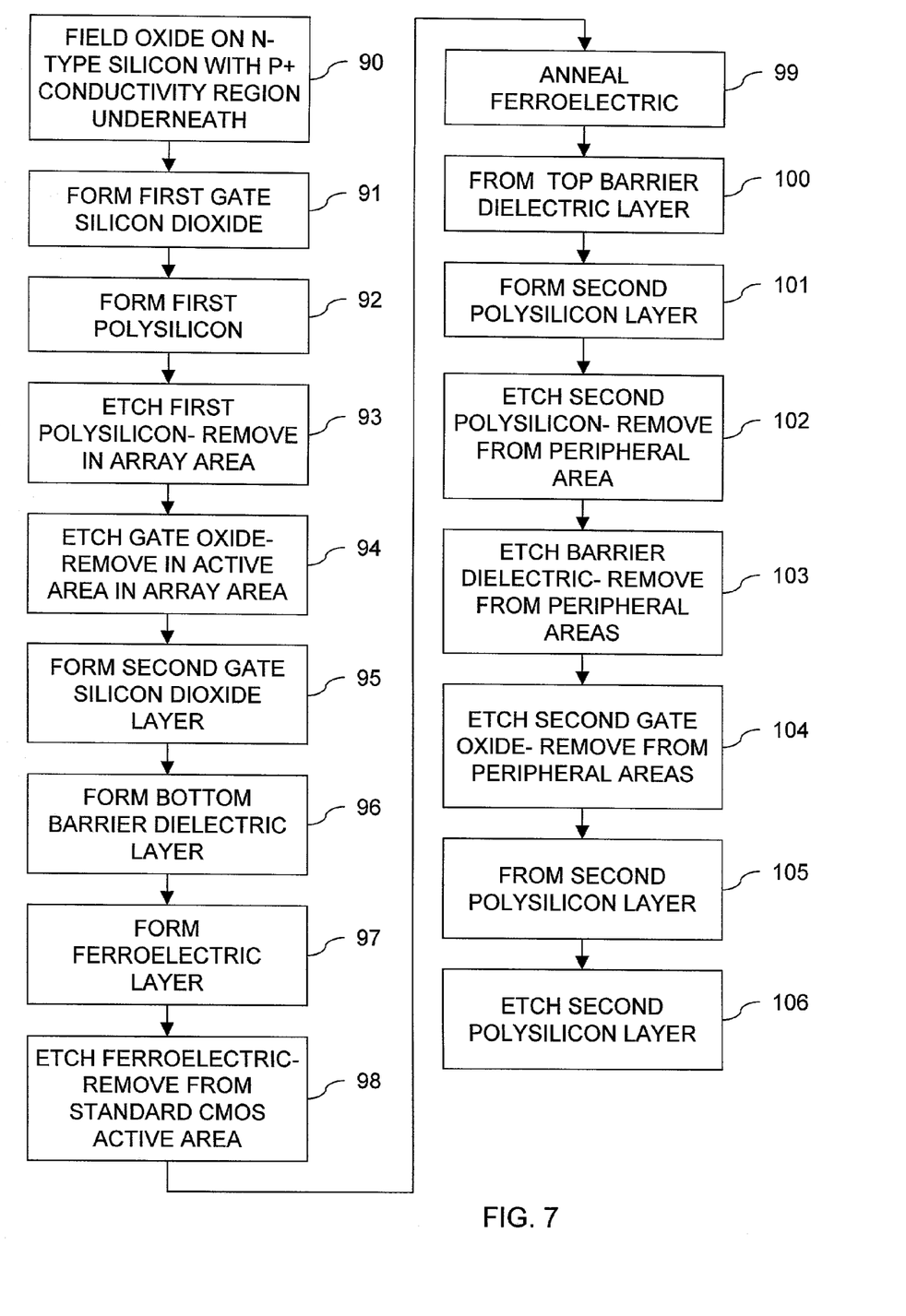
FIG. 7 illustrates the process steps in another embodiment wherein separate gate dielectric layers and separate electrode depositions form the CMOS peripheral FETs and the array ferroelectric FETs.

FIG. 7 illustrates the process steps in another embodiment wherein separate gate dielectric layers and separate electrode layers form the CMOS peripheral FETs and the array ferroelectric FETs. Field regions with underlying p+ regions are formed using a LOCOS process. A first gate silicon dioxide layer is formed (91), followed by formation of a polysilicon layer (92). The polysilicon layer is then patterned and etched, being completely removed in the array area (93). The gate oxide is then etched, also being completely removed in the active areas of the array area (94). This first gate silicon dioxide layer and this first polysilicon layer form the standard CMOS FET. A second gate oxide layer is formed (95), followed by the formation of the bottom barrier dielectric layer (96), followed by the formation of the ferroelectric layer (97). The ferroelectric layer is patterned and etched, being completely removed from the peripheral area (98). The bottom barrier dielectric layer is exposed in the peripheral area. The ferroelectric is annealed as required (99), followed by the formation of the top barrier dielectric layer (100). Note that the top barrier dielectric layer is formed directly on the bottom dielectric layer in the peripheral area. The second polysilicon layer is formed (101), followed by patterning and etching of the second polysilicon layer (102), being completely removed from the peripheral area. The top and bottom barrier dielectric layers are removed from the peripheral area, one etch removing both layers since the top barrier dielectric layer lies directly on top of the bottom barrier dielectric layer in the peripheral area (103). The second gate oxide layer is etched, being completely removed from the peripheral area (104). The second polysilicon layer is now deposited (105), and patterned and etched, being completely removed from the peripheral area (106).

In a variation of this embodiment, a metal in the standard CMOS process, platinum, another metal, or a semiconducting electrode is used as the gate electrode of the ferroelectric FETs in the memory array instead of the polysilicon.

Figure 8:
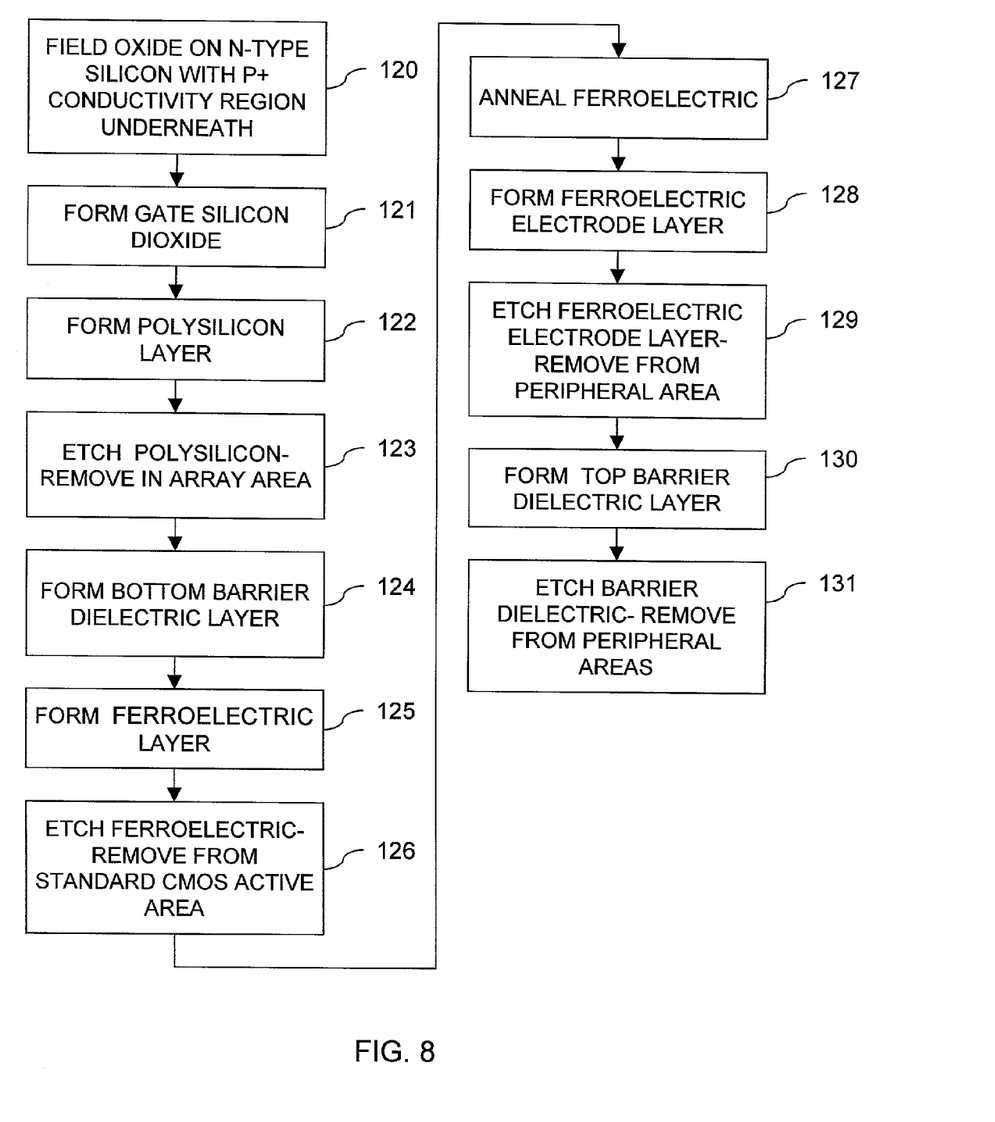
FIG. 8 illustrates the process steps of another embodiment wherein an electrode is deposited directly on the ferroelectric material.

FIG. 8 illustrates the process steps of another embodiment wherein an electrode is deposited directly on the ferroelectric material, as may be required for some ferroelectric materials for lattice matching or to obtain nonvolatile memory properties of the ferroelectric material. Field oxide regions with P+ conductivity type underneath are formed using LOCOS processing (120). A gate silicon dioxide layer is formed (121), followed by the formation of a polysilicon layer (121). The polysilicon layer is then patterned and etched, being completely removed from the array area (123). The bottom barrier dielectric is formed (124), followed by the formation of the ferroelectric layer (125). The ferroelectric layer is patterned and etched, being completely removed from the peripheral area (126). The ferroelectric is annealed according to the ferroelectric material requirements (127). A ferroelectric electrode layer is formed (128). One example of a typical ferroelectric electrode layer material is platinum. The ferroelectric electrode layer is patterned and etched, being completely removed in the peripheral area (129). The top barrier dielectric layer is formed (130). The bottom and top barrier dielectric layers are removed in the peripheral area (131).

Figure 9:
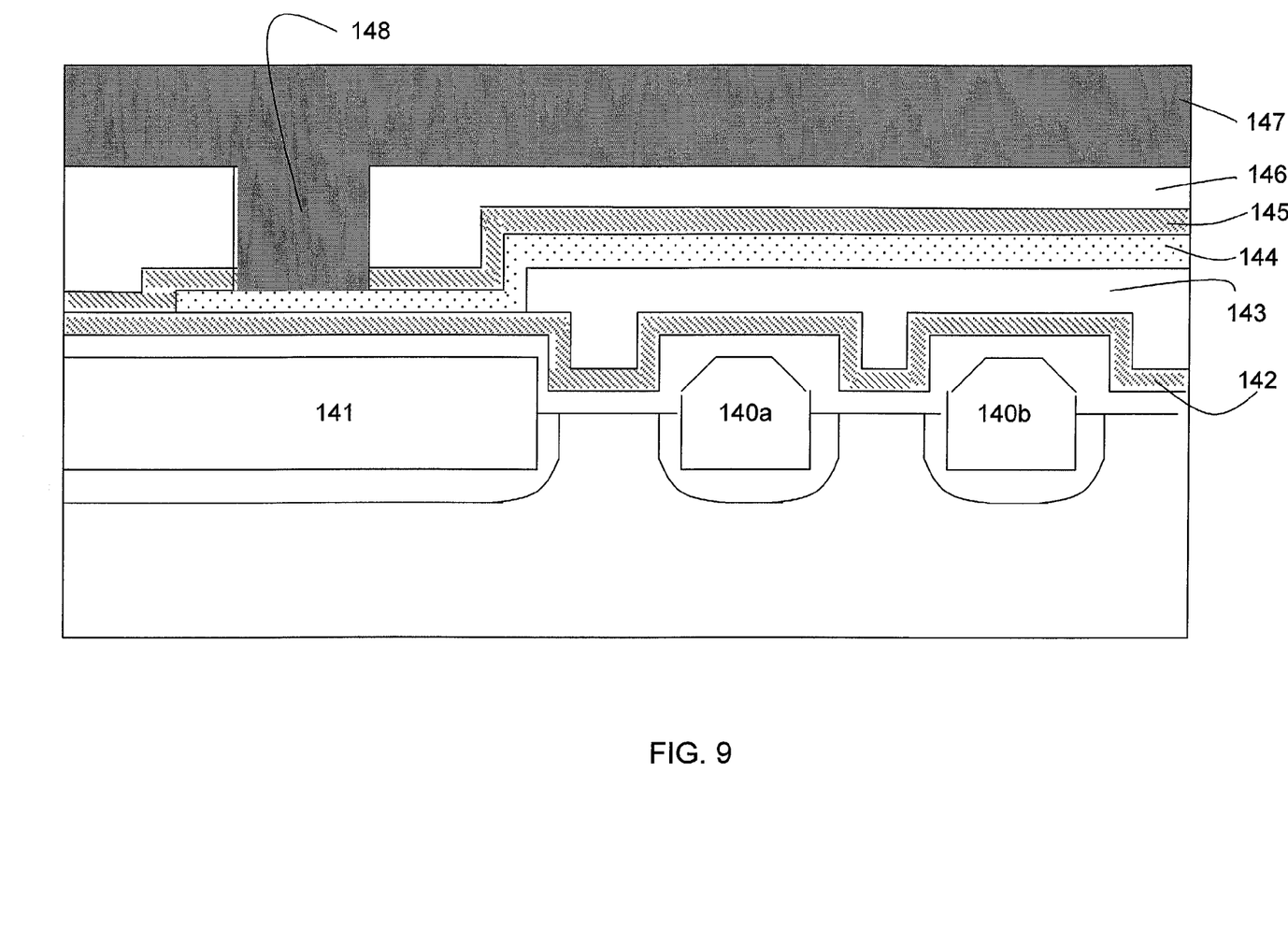
FIG. 9 is a cross-sectional diagram illustrating the resulting structure of FIG. 8. Dimensions are not to scale.

FIG. 9 is a cross-sectional diagram illustrating the resulting structure of this embodiment at the edge of the array. Bottom barrier dielectric layer 142 overlies field oxide regions 140a, 140b, and 141, region 141 being a field oxide region at the edge of the array. Ferroelectric layer 143 overlies the bottom barrier 142, ferroelectric layer 143 being removed from the edge of the array region. Ferroelectric electrode layer 144 overlies the ferroelectric layer 143 and bottom barrier dielectric layer 142 where the ferroelectric layer is removed from the edge of the array. Top barrier dielectric 145 overlies ferroelectric electrode layer 144. Dielectric layer 146 and metal layer 147, formed as part of the standard CMOS process, overly the top barrier dielectric. Contact is made to the ferroelectric electrode layer via contact hole 148, connecting metal layer 147 and ferroelectric electrode layer 144. In this embodiment, the top barrier dielectric layer is broken in order to make contact to the ferroelectric electrode layer below the top barrier dielectric layer. The contact hole is made sufficient distance from the edge of the ferroelectric layer to minimize the effects of breaking the top barrier dielectric layer.

In a variation of this embodiment, bottom barrier dielectric layer 142 is not formed in cases where the ferroelectric material requirements allow direct contact of the ferroelectric material with the silicon.

In this embodiment, the individual memory storage element is any memory cell that is interconnected with layers of conductive or semiconductor material that does not require breaking bottom barrier dielectric layer 142 to make contact and that is interconnected by a single layer of conductive or semiconductor material which is contacted to other layers of conductive or semiconductor material by breaking the top barrier dielectric layer at the edge of the array a sufficient distance beyond the edge of the ferroelectric layer.

The foregoing description is only illustrative of the invention. Various alternatives and modifications can be devised by those skilled in the art without departing from the invention. In particular, though the embodiment has been described with reference to a ferroelectric FET formed on N-type silicon with buried P-type source and drain regions, any ferroelectric FET which interconnects sources and drains with connection means below the bottom barrier dielectric layer is within the scope of this invention, including a ferroelectric FET formed on P-type silicon with buried N-type source/drains. Further, wherever fabrication steps have been described, additional fabrication steps may be inserted between those steps. Further, though reference has been made to a specific process sequence in the embodiments, those skilled in the art can change the order of some of these process steps without departing from the inventions. Further, though steps to anneal the ferroelectric material have been described in the embodiment, such steps could be moved or combined with other anneal steps in the standard CMOS process, depending on the annealing requirements of the specific ferroelectric material used. Accordingly, the present invention embraces all such alternatives, modifications, and variances that fall within the scope of the appended claims.

What is claimed is:

1. An array of ferroelectric field effect transistors (FETs), the array comprising:
   (a) a first conductivity type semiconductor region;
   (b) at least one second conductivity type source region, each source region within the first conductivity type semiconductor region;
   (c) at least one second conductivity type drain region, each drain region within the first conductivity type semiconductor region, paired with and spaced apart from one of the source regions;
   (d) a first dielectric layer at least covering the first conductivity type semiconductor region between each source region and drain region pair, the first dielectric layer continuous across the array;
   (e) a ferroelectric layer against the first dielectric layer, opposite each source region and drain region pair;
   (f) a second dielectric layer having opposing sides, one of the opposing sides facing the ferroelectric layer, the second dielectric layer together with the first dielectric layer encapsulating the ferroelectric layer, the second dielectric layer continuous across the array and extending beyond the ferroelectric layer; and
   (g) at least one gate electrode layer formed against the side of the second dielectric layer that is opposite the side of the second dielectric layer facing the ferroelectric layer, wherein the at least one gate electrode layer, in combination with a polarization state of the ferroelectric layer, controls the current flow between the source and drain regions.

2. The array of claim 1 wherein the ferroelectric layer is formed of a material selected from the group consisting of Cerium Manganates, Cerium Chromates, Niobates, and a class of ferroelectric materials with low dielectric constants.

3. The array of claim 1 wherein the second dielectric layer is formed of at least one material selected from the group consisting of silicon dioxide, silicon nitride, and aluminum oxide.

4. The array of claim 1 wherein the first dielectric layer is formed of at least one material selected from the group consisting of silicon dioxide, silicon nitride, and aluminum oxide.

5. The array of claim 1 wherein the second dielectric layer is formed of at least one layer of dielectric material.

6. The array of claim 1 wherein the first dielectric layer is formed of at least one layer of dielectric material.

7. The array of claim 1 wherein the first dielectric layer is formed of a material impermeable to hydrogen.

8. The array of claim 1 wherein the second dielectric layer is formed of a hydrogen absorbing material.

9. The array of claim 1 wherein the first dielectric layer is formed of a hydrogen absorbing material.

10. The array of claim 1 wherein the second dielectric layer is formed of at least one material impermeable to the materials of the ferroelectric layer.

11. The array of claim 1 wherein the first dielectric layer is formed of at least one material impermeable to the materials of the ferroelectric.

12. The array of claim 1 wherein the first conductivity type semiconductor region is formed of silicon substrate.

13. The array of claim 1 further including a second conductivity type substrate and wherein the first conductivity type semiconductor region is formed on the second conductivity type substrate.

14. The array of claim 1 further including an insulator and wherein the first conductivity type silicon is formed on the insulator.

15. The array of claim 1 wherein the first dielectric layer is formed from at least one material selected from the group consisting of polysilicon and metal.

16. The array of claim 1 wherein the second dielectric layer is formed from at least one material impermeable to hydrogen.

17. The array of claim 1 wherein the first dielectric layer is an electrically insulating layer.

18. An array of ferroelectric field effect transistors (FETs), the array comprising:
   (a) a first conductivity type semiconductor region;

(b) at least one second conductivity type source region, each source region within the first conductivity type semiconductor region;
(c) at least one second conductivity type drain region, each drain region within the first conductivity type semiconductor region, paired with and spaced apart from one of the source regions;
(d) a gate dielectric layer at least covering the first conductivity type semiconductor region between each source region and drain region pair, the gate dielectric layer continuous across the array;
(e) a first dielectric layer covering the gate dielectric layer;
(f) a ferroelectric layer against the first dielectric layer, opposite each source region and drain region pair;
(g) a second dielectric layer having opposing sides, one of the opposing sides facing the ferroelectric layer, the second dielectric layer together with the first dielectric layer encapsulating the ferroelectric layer, the second dielectric layer continuous across the array and extending beyond the ferroelectric layer; and
(h) at least one gate electrode layer formed against the side of the second dielectric layer that is opposite the side of the second dielectric layer facing the ferroelectric layer, wherein the at least one gate electrode layer, in combination with a polarization state of the ferroelectric layer, controls the current flow between the source and drain regions.

19. The array of claim 18 wherein the gate dielectric is formed of silicon dioxide.

20. The array of claim 18 wherein the ferroelectric layer is formed of a material selected from the group consisting of Cerium Manganates, Cerium Chromates, Niobates, and a class of ferroelectric materials with low dielectric constants.

21. The array of claim 18 wherein the second dielectric layer is formed of at least one material selected from the group consisting of silicon dioxide, silicon nitride, and aluminum oxide.

22. The array of claim 18 wherein the first dielectric layer is formed of at least one material selected from the group consisting of silicon dioxide, silicone nitride, and aluminum oxide.

23. The array of claim 18 wherein the second dielectric layer is formed of at least one layer of dielectric material.

24. The array of claim 18 wherein the first dielectric layer is formed of at least one layer of dielectric material.

25. The array of claim 18 wherein the first dielectric layer is formed of a material impermeable to hydrogen.

26. The array of claim 18 wherein the second dielectric layer is formed of a hydrogen absorbing material.

27. The array of claim 18 wherein the first dielectric layer is formed of a hydrogen absorbing material.

28. The array of claim 18 wherein the second dielectric layer is formed of at least one material impermeable to the materials of the ferroelectric layer.

29. The array of claim 18 wherein the first dielectric layer is formed of at least one material impermeable to the materials of the ferroelectric.

30. The array of claim 18 wherein the first conductivity type semiconductor region is formed of silicon substrate.

31. The array of claim 18 further including a second conductivity type substrate and wherein the first conductivity type semiconductor region is formed on the second conductivity type substrate.

32. The array of claim 18 further including an insulator and wherein the first conductivity type silicon is formed on the insulator.

33. The array of claim 18 wherein the first dielectric layer is formed from at least one material selected from the group consisting of polysilicon and metal.

34. The array of claim 18 wherein the second dielectric layer is formed from at least one material impermeable to hydrogen.

35. The array of claim 18 wherein the gate dielectric layer is an electrically insulating layer.

36. An array of ferroelectric field effect transistors (FETs), the array comprising:
(a) a first conductivity type semiconductor region;
(b) at least one second conductivity type source region, each source region within the first conductivity type semiconductor region;
(c) at least one second conductivity type drain region, each drain region within the first conductivity type semiconductor region, paired with and spaced apart from one of the source regions;
(d) a first dielectric layer at least covering the first conductivity type semiconductor region between each source region and drain region pair, the first dielectric layer continuous across the array;
(e) a ferroelectric layer against the first dielectric layer, opposite each source region and drain region pair, the ferroelectric layer continuous across the array;
(f) gate electrode layer formed against the ferroelectric layer, wherein the gate electrode layer, in combination with a polarization state of the ferroelectric layer, controls the current flow between the source and drain regions; and
(g) a second dielectric layer extending beyond the ferroelectric layer, the second dielectric layer together with the first dielectric layer encapsulating the ferroelectric layer and the electrode layer, the second dielectric layer continuous across the array and extending beyond the ferroelectric layer.

37. The array of claim 36 wherein the ferroelectric layer is formed of a material selected from the group consisting of Cerium Manganates, Cerium Chromates, Niobates, and a class of ferroelectric materials with low dielectric constants.

38. The array of claim 36 wherein the second dielectric layer is formed of at least one material selected from the group consisting of silicon dioxide, silicon nitride, and aluminum oxide.

39. The array of claim 36 wherein the first dielectric layer is formed of at least one material selected from the group consisting of silicon dioxide, silicon nitride, and aluminum oxide.

40. The array of claim 36 wherein the second dielectric layer is formed of at least one layer of dielectric material.

41. The array of claim 36 wherein the first dielectric layer is formed of at least one layer of dielectric material.

42. The array of claim 36 wherein the first dielectric layer is formed of a material impermeable to hydrogen.

43. The array of claim 36 wherein the second dielectric layer is formed of a hydrogen absorbing material.

44. The array of claim 36 wherein the first dielectric layer is formed of a hydrogen absorbing material.

45. The array of claim 36 wherein the second dielectric layer is formed of at least one material impermeable to the materials of the ferroelectric layer.

46. The array of claim 36 wherein the first dielectric layer is formed of at least one material impermeable to the materials of the ferroelectric.

47. The array of claim 36 wherein the first conductivity type semiconductor region is formed of silicon substrate.

48. The array of claim 36 further including a second conductivity type substrate and wherein the first conductivity type semiconductor region is formed on the second conductivity type substrate.

49. The array of claim 36 further including an insulator and wherein the first conductivity type silicon is formed on the insulator.

50. The array of claim 36 wherein the first dielectric layer is formed from at least one material selected from the group consisting of polysilicon and metal.

51. The array of claim 36 wherein the second dielectric layer is formed from at least one material impermeable to hydrogen.

52. The array of claim 36 wherein the first dielectric layer is an electrically insulating layer.

53. An array of ferroelectric field effect transistors (FETs), the array comprising:
   (a) a first conductivity type semiconductor region;
   (b) at least one second conductivity type source region, each source region within the first conductivity type semiconductor region;
   (c) at least one second conductivity type drain region, each drain region within the first conductivity type semiconductor region, paired with and spaced apart from one of the source regions;
   (d) a first dielectric layer at least covering the first conductivity type semiconductor region between each source region and drain region pair, the first dielectric layer continuous across the array;
   (e) a ferroelectric layer against the first dielectric layer, opposite each source region and drain region pair, the ferroelectric layer continuous across the array;
   (f) a second dielectric layer together with the first dielectric layer encapsulating the ferroelectric layer, the second dielectric layer continuous across the array and extending beyond the ferroelectric layer; and
   (g) at least one gate electrode layer formed against the second dielectric layer, wherein the at least one gate electrode layer, in combination with a polarization state of the ferroelectric layer, controls the current flow between the source and drain regions.

54. An array of ferroelectric field effect transistors (FETs), the array comprising:
   (a) a first conductivity type semiconductor region;
   (b) at least one second conductivity type source region, each source region within the first conductivity type semiconductor region;
   (c) at least one second conductivity type drain region, each drain region within the first conductivity type semiconductor region, paired with and spaced apart from one of the source regions;
   (d) a gate dielectric layer at least covering the first conductivity type semiconductor region between each source region and drain region pair, the gate dielectric layer continuous across the array;
   (e) a first dielectric layer covering the gate dielectric layer;
   (f) a ferroelectric layer against the first dielectric layer, opposite each source region and drain region pair, the ferroelectric layer continuous across the array;
   (g) a second dielectric layer together with the first dielectric layer encapsulating the ferroelectric layer, the second dielectric layer continuous across the array and extending beyond the ferroelectric layer; and
   (h) at least one gate electrode layer formed against the second dielectric layer, wherein the at least one gate electrode layer, in combination with a polarization state of the ferroelectric layer, controls the current flow between the source and drain regions.

* * * * *